US010482973B2

(12) United States Patent
Lee et al.

(10) Patent No.: US 10,482,973 B2
(45) Date of Patent: Nov. 19, 2019

(54) MEMORY DEVICES INCLUDING A WORD LINE DEFECT DETECTION CIRCUIT

(71) Applicant: Samsung Electronics Co. Ltd., Suwon-si, Gyeonggi-do (KR)

(72) Inventors: Jae-Yun Lee, Anyang-si (KR); Joon Soo Kwon, Seoul (KR); Byung Soo Kim, Yongin-si (KR); Sang-Soo Park, Hwaseong-si (KR); Il Han Park, Suwon-si (KR); Jong-Hoon Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/014,222

(22) Filed: Jun. 21, 2018

(65) Prior Publication Data
US 2019/0147961 A1     May 16, 2019

(30) Foreign Application Priority Data

Nov. 14, 2017 (KR) .................. 10-2017-0151619

(51) Int. Cl.
| G11C 16/12 | (2006.01) |
|---|---|
| H03K 5/135 | (2006.01) |
| G11C 16/16 | (2006.01) |
| G11C 16/32 | (2006.01) |
| G11C 8/08 | (2006.01) |
| G11C 16/08 | (2006.01) |

(Continued)

(52) U.S. Cl.
CPC .............. *G11C 16/12* (2013.01); *G11C 5/147* (2013.01); *G11C 7/222* (2013.01); *G11C 8/08* (2013.01); *G11C 16/08* (2013.01); *G11C 16/16* (2013.01); *G11C 16/30* (2013.01); *G11C 16/32* (2013.01); *H03K 3/011* (2013.01); *H03K 5/135* (2013.01); *G11C 16/0483* (2013.01)

(58) Field of Classification Search
CPC ...... G11C 16/12–32; G11C 5/147; G11C 8/08
See application file for complete search history.

(56) References Cited

U.S. PATENT DOCUMENTS

| 6,279,070 B1 | 8/2001 | Jeong |
|---|---|---|
| 6,469,933 B2 | 10/2002 | Choi |

(Continued)

FOREIGN PATENT DOCUMENTS

| JP | 3931615 | 3/2007 |
|---|---|---|
| KR | 1020060059283 | 6/2006 |

*Primary Examiner* — Han Yang
(74) *Attorney, Agent, or Firm* — Myers Bigel, P.A.

(57) ABSTRACT

A memory device can include: a memory cell array including a memory cell and a word line that is connected to the memory cell; a clock generator configured to generate a first pumping clock signal from a system clock signal; a charge pump configured to provide a pumping voltage signal using a power supply voltage and the first pumping clock signal; a compensation circuit configured to compensate for variations in a first reference clock signal in accordance with variations in the power supply voltage, and provide a compensated first reference clock signal; and a pass/fail (P/F) determining circuit configured to determine whether the word line is defective by comparing the first pumping clock signal and the compensated first reference clock signal while the pumping voltage signal is provided to the word line.

20 Claims, 19 Drawing Sheets

(51) Int. Cl.
*H03K 3/011* (2006.01)
*G11C 16/30* (2006.01)
*G11C 5/14* (2006.01)
*G11C 7/22* (2006.01)
*G11C 16/04* (2006.01)

(56) References Cited

U.S. PATENT DOCUMENTS

| | | |
|---|---|---|
| 7,233,213 B2 | 6/2007 | Won |
| 7,688,631 B2 | 3/2010 | Kim |
| 7,697,327 B2 | 4/2010 | Kim |
| 7,940,117 B2 | 5/2011 | Jeon |
| 8,400,838 B2 | 3/2013 | Kumazaki |
| 8,432,744 B2 | 4/2013 | Umezawa |
| 8,817,553 B2 | 8/2014 | Yu |
| 9,189,174 B2 | 11/2015 | Lee |
| 9,698,676 B1 | 7/2017 | Huynh et al. |
| 2011/0249492 A1* | 10/2011 | Kumazaki .............. G11C 5/145 365/185.2 |
| 2015/0009742 A1* | 1/2015 | Kang .................... G11C 17/18 365/96 |

* cited by examiner

FIG. 8
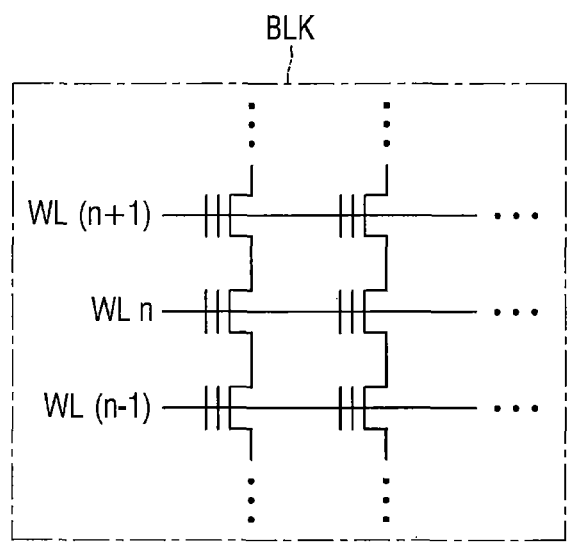
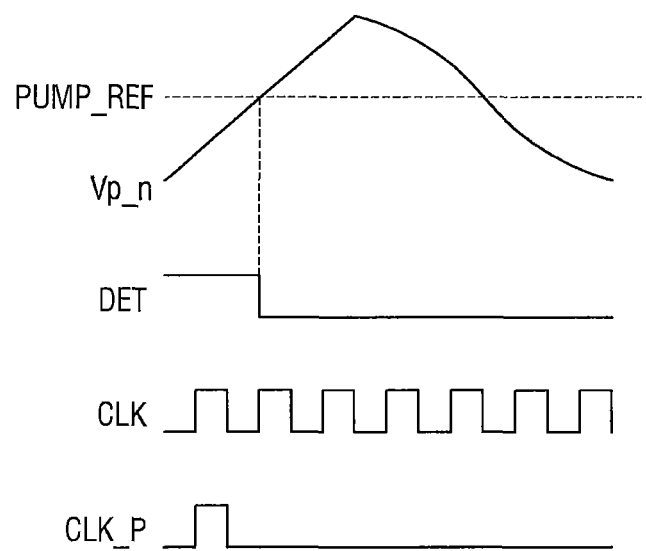

FIG. 9
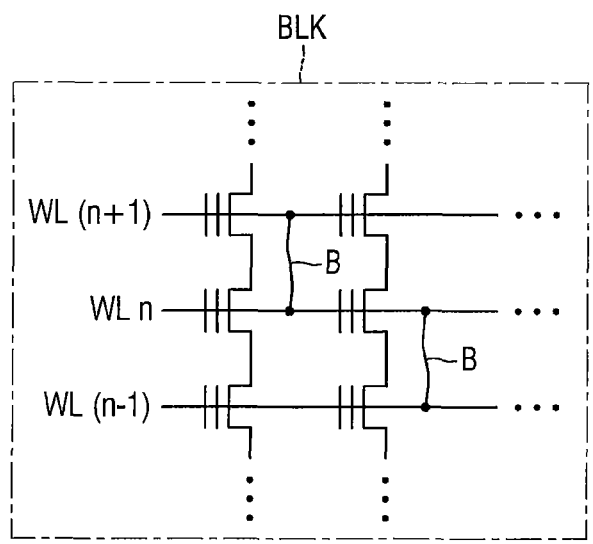
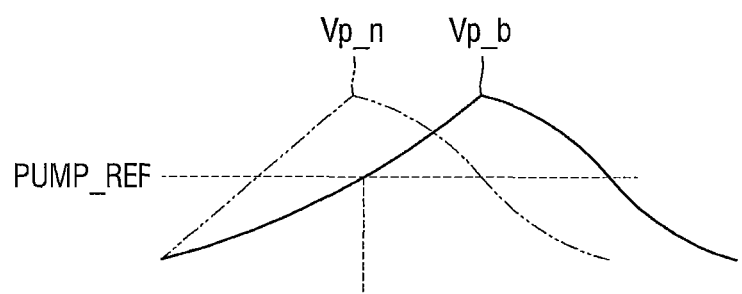

MEMORY DEVICES INCLUDING A WORD LINE DEFECT DETECTION CIRCUIT

This U.S. nonprovisional patent application claims priority under 35 U.S.C § 119 to Korean Patent Application No. 10-2017-0151619, filed on Nov. 14, 2017, the entire contents of which are incorporated herein by reference.

BACKGROUND

Field

The present disclosure relates to memory devices and, more particularly, memory devices including a word line defect detection circuit and operating methods of the memory devices.

Description of the Related Art

A memory device is a storage device capable of storing and reading data as necessary. Memory devices may be divided into nonvolatile memory (NVM) devices from which stored data does not disappear when power is no longer supplied, and volatile memory (VM) devices from which stored data disappears if power is no longer supplied.

In order to control a plurality of memory cells included in a memory device, various electrical connections may be arranged and used. Examples of the electrical connections include word lines and bit lines, which are connected to one or more of the memory cells.

As the size of memory devices decreases, the distance between the electrical connections also decreases. Accordingly, various defects such as a bridge defect, which is a short between electrical connections that are supposed to be insulated from each other, may occur. These defects deteriorate the operating performance of the memory device and thus need to be addressed.

SUMMARY

Embodiments described herein provide memory devices with an improved operating performance and/or reliability.

Embodiments described herein also provide operating methods of a memory device with an improved operating performance and/or reliability.

However, the embodiments of the inventive concepts described herein are not restricted to those set forth herein. The above and other embodiments of the inventive concepts will become more apparent to one of ordinary skill in the art to which the inventive concepts pertain by referencing the detailed description of the inventive concepts given below.

According to some embodiments of the inventive concepts, a memory device may include: a memory cell array including a memory cell and a word line that is connected to the memory cell; a clock generator configured to generate a first pumping clock signal from a system clock signal; a charge pump configured to provide a pumping voltage signal using a power supply voltage and the first pumping clock signal; a compensation circuit configured to compensate for variations in a first reference clock signal in accordance with variations in the power supply voltage, and provide a compensated first reference clock signal; and a pass/fail (P/F) determining circuit configured to determine whether the word line is defective by comparing the first pumping clock signal and the compensated first reference clock signal while the pumping voltage signal is provided to the word line.

According to some embodiments of the inventive concepts, a driving method of a memory device may include: providing a memory cell array including a first word line connected to a first memory cell, and a second word line connected to a second memory cell; setting a first reference clock signal; determining if a first defect is present in the first word line by comparing a first pumping clock signal associated with a first program voltage of the first memory cell, and the first reference clock signal while applying the first program voltage to the first word line; setting the first pumping clock signal as a second reference clock signal; and determining if a second defect is present in the second word line by comparing a second pumping clock signal associated with a second program voltage of the second memory cell, and the second reference clock signal while applying the second program voltage to the second word line.

According to some embodiments of the inventive concepts, a memory device may include: a memory cell array including a memory cell and a word line that is connected to the memory cell; a voltage generator configured to generate an operating voltage to be provided to the word line, based on a power supply voltage and a first system clock signal that varies in accordance with variations in the power supply voltage; a pumping clock generating circuit configured to generate a pumping clock signal based on a second system clock signal, which is independent from variations in the power supply voltage; and a P/F determining circuit configured to determine whether the word line is defective by comparing the pumping clock signal and a reference clock signal while the operating voltage is provided to the word line.

According to some embodiments of the inventive concepts, a memory device may include: a memory cell array comprising a memory cell and a word line that is connected to the memory cell; a voltage generator configured to receive a power supply voltage, generate a pumping clock signal, and provide an operating voltage to the word line to program the memory cell; a compensation circuit configured to provide a compensated reference clock signal that compensates for variations in the power supply voltage and; a pass/fail (P/F) determining circuit configured to determine whether the word line is defective by comparing a first number of pulses included in the pumping clock signal and a second number of pulses included in the compensated reference clock signal.

Other features and embodiments may be apparent from the following detailed description, the drawings, and the claims.

BRIEF DESCRIPTION OF THE DRAWINGS

The above and other embodiments and features of the inventive concepts will become more apparent by describing in detail embodiments thereof with reference to the attached drawings, in which:

FIGS. 8 and 9 are diagrams illustrating a word line defect detection operation of the NVM device according to some embodiments of the inventive concepts.

DETAILED DESCRIPTION

Figure 1:
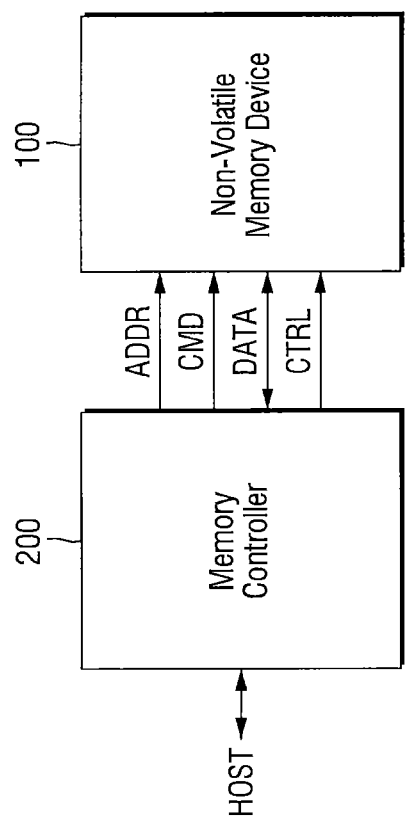
FIG. 1 is a block diagram illustrating a nonvolatile memory (NVM) system according to some embodiments of the inventive concepts.

FIG. 1 is a block diagram illustrating a nonvolatile memory (NVM) system according to some embodiments of the inventive concepts.

Referring to FIG. 1, the NVM system may include a memory controller 200 and an NVM device 100. The example of the NVM system in FIG. 1 includes a data storage medium based on a flash memory such as, for example, a memory card, a universal serial bus (USB) memory, and/or a solid state drive (SSD), but the present inventive concepts are not limited thereto.

The memory controller 200 may be connected to a host HOST and the NVM device 100. The memory controller 200 may be configured to access the NVM device 100 in response to a request from the host HOST. The memory controller 200 may also be configured to provide an interface between the NVM device 100 and the host HOST. The memory controller 200 may also be configured to execute firmware for controlling the NVM device 100.

The memory controller 200 may control the operation of the NVM device 100. Specifically, the memory controller 200 may provide commands CMD, addresses ADDR, control signals CTRL, and/or data DATA via input/output (I/O) lines connected to the NVM device 100.

The control signals CTRL, provided by the memory controller 200 to the NVM device 100, may include, for example, a chip enable signal CE, a write enable signal WE, and/or a read enable signal RE, but the present inventive concepts are not limited thereto.

The memory controller 200 may include an error correction code (ECC) circuit, which corrects error bits included in data, but the present inventive concepts are not limited thereto. In some embodiments, the ECC circuit may be provided as an element of the NVM device 100.

The memory controller 200 and the NVM device 100 may be provided as chips, packages, and/or modules. In some embodiments, the memory controller 200 and the NVM device 100 may be mounted using a package such as a package on package (PoP), a ball grid array (BGA), a chip scale package (CSP), a plastic leaded chip carrier (PLCC), a plastic dual in-line package (PDIP), a die in waffle pack, a die in wafer form, a chip on board (COB), a ceramic dual in-line package (CERDIP), a plastic metric quad flat pack (MQFP), a thin quad flat pack (TQFP), a small outline integrated circuit (SOIC), a shrink small outline package (SSOP), a thin small outline package (TSOP), a thin quad flat pack (TQFP), a system in package (SIP), a multi-chip package (MCP), a wafer-level fabricated package (WFP), a wafer-level processed stack package (WSP), or the like.

The configuration of the NVM device 100 will hereinafter be described with reference to FIG. 2.

Figure 2:
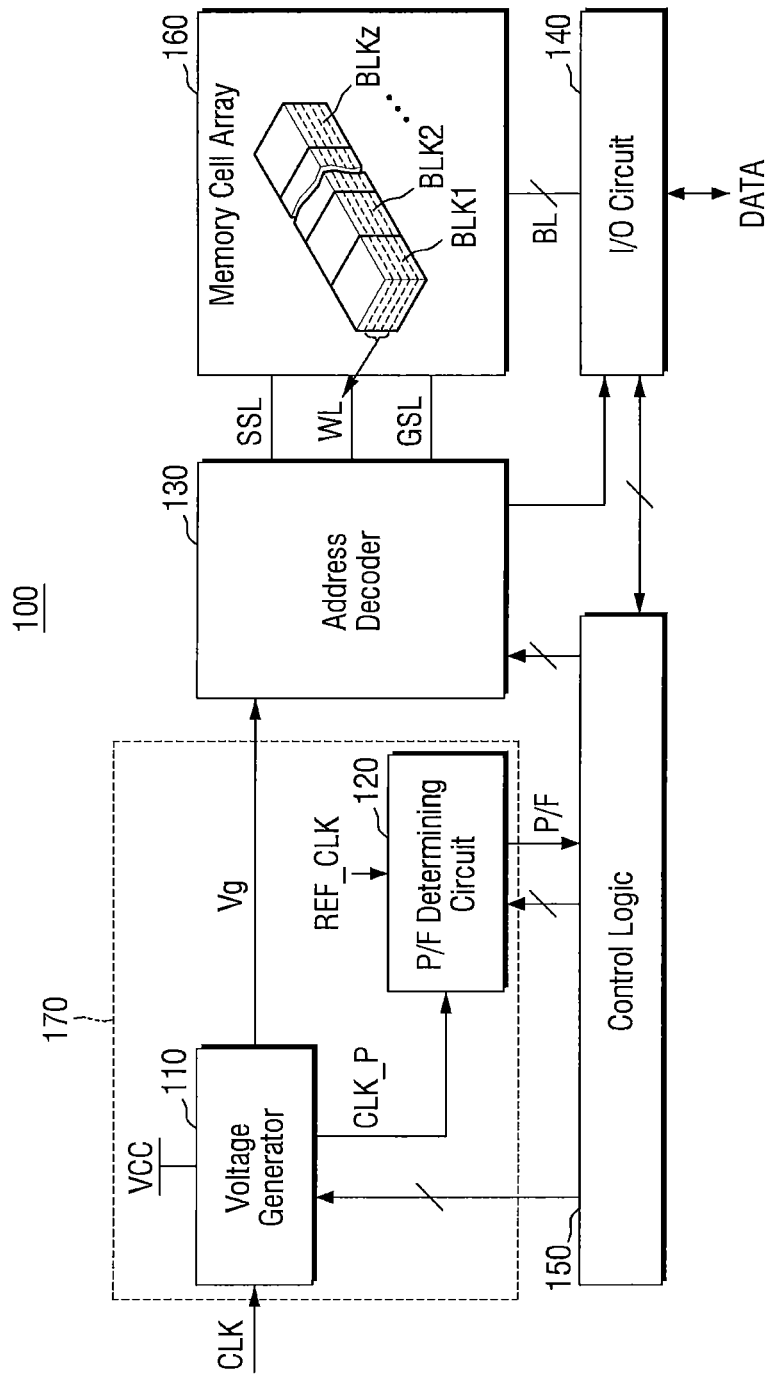
FIG. 2 is a block diagram illustrating the NVM device of FIG. 1.

FIG. 2 is a block diagram illustrating the NVM device of FIG. 1.

Referring to FIG. 2, the NVM device 100 may include a word line defect detection circuit 170, an address decoder 130, an I/O circuit 140, a control logic 150, and a memory cell array 160.

The NVM device 100 may be or include, for example, a NAND flash memory device, a vertical NAND (VNAND) device, a NOR flash memory device, a resistive random access memory (RRAM) device, a phase-change memory (PRAM) device, a magnetoresistive random access memory (MRAM) device, a ferroelectric random access memory (FRAM) device, and/or a spin transfer torque-random access memory (STT-RAM) device, but the present inventive concepts are not limited thereto. The NVM device 100 will hereinafter be described as being a VNAND device, but the present inventive concepts are not limited thereto. That is, various NVM devices other than a VNAND device are also applicable to the NVM device 100.

The word line defect detection circuit 170 may detect defects in wires and/or electrical connections disposed in the memory cell array 160. Specifically, the word line defect detection circuit 170 may detect defects in a plurality of word lines WL disposed in the memory cell array 160 using, for example, a pumping clock signal CLK_P. In response to a word line defect being detected by the word line defect detection circuit 170, the word line defect detection circuit 170 may provide word line defect information to the control logic 150.

The word line defect detection circuit 170 may include a voltage generator 110 and a pass/fail (P/F) determining circuit 120.

The voltage generator 110 may generate an operating voltage Vg, which is used for the operation of the NVM device 100, using a power supply voltage Vcc. Examples of the operating voltage Vg include a program voltage, a pass voltage, a read voltage, a read pass voltage, a verify voltage, an erase voltage, a common source line voltage, and/or a well voltage, but the present inventive concepts are not limited thereto. The voltage generator 110 may generate a word line voltage for programming data to, or reading or erasing data from, memory cells disposed in the memory cell array 160. The voltage generator 110 will hereinafter be described with reference to FIG. 3.

Figure 3:
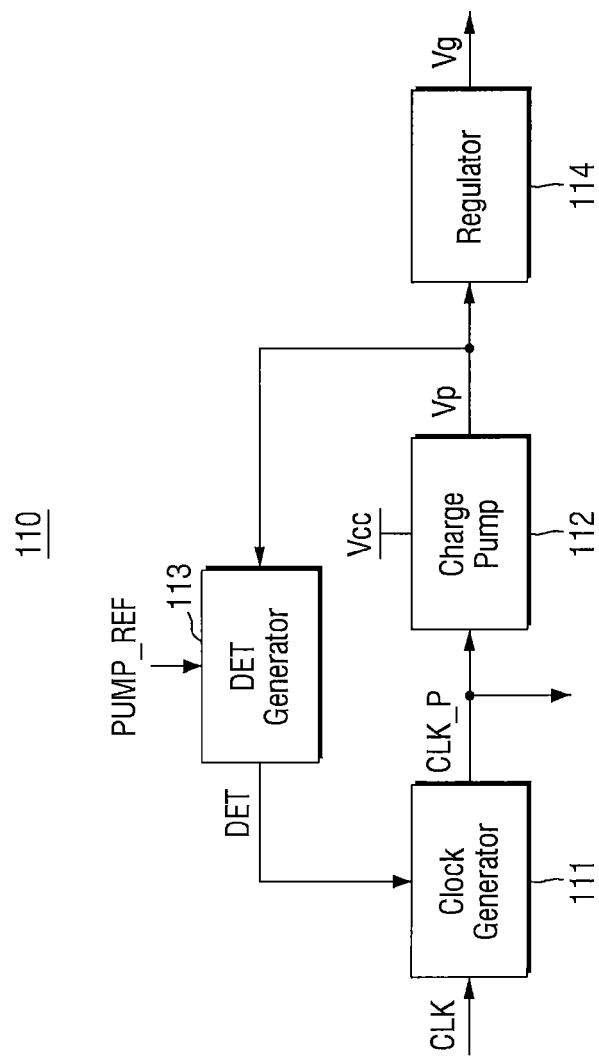
FIG. 3 is a block diagram illustrating the voltage generator of FIG. 2.

FIG. 3 is a block diagram illustrating the voltage generator of FIG. 2.

Referring to FIG. 3, the voltage generator 110 may include a clock generator 111, a charge pump 112, a determination signal generator 113, and a regulator 114.

The clock generator 111 may generate and output the pumping clock signal CLK_P using a system clock signal CLK provided thereto from the outside. Specifically, the clock generator 111 may generate the pumping clock signal CLK_P from the system clock signal CLK by using a determination signal DET output by the determination signal generator 113, and may output the pumping clock signal CLK_P. The pumping clock signal CLK_P may include a plurality of pulses and may be part of the system clock signal CLK. The pumping clock signal CLK_P will be described later in detail.

The charge pump 112 may include a plurality of charge pump circuits and a control circuit. Each of the charge pump circuits may be enabled or disabled by the control circuit and may perform a charge pumping operation using the pumping clock signal CLK_P provided by the clock generator 111 and the power supply voltage Vcc.

The regulator 114 may generate the operating voltage Vg by regulating a pumping voltage signal Vp output by the charge pump 112, and may provide the operating voltage Vg to the memory cell array 160 of FIG. 2 via the address decoder 130 of FIG. 2.

The determination signal generator 113 may generate the determination signal DET by comparing the pumping voltage signal Vp output by the charge pump 112 with a reference pumping voltage PUMP_REF. The determination signal DET may be provided to the clock generator 111 and may be used to generate the pumping clock signal CLK_P.

The generation of the pumping clock signal CLK_P will hereinafter be described with reference to FIG. 4.

Figure 4:
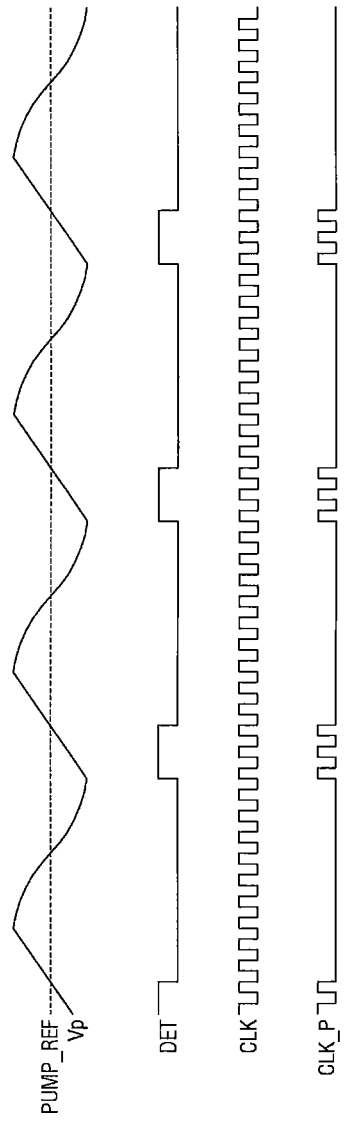
FIG. 4 is a diagram illustrating the pumping clock signal of FIG. 3.

FIG. 4 is a diagram illustrating the pumping clock signal of FIG. 3.

Referring to FIGS. 3 and 4, the determination signal generator 113 may generate the determination signal DET by comparing the pumping voltage signal Vp output by the charge pump 112 with the reference pumping voltage PUMP_REF. For example, as illustrated in FIG. 4, the determination signal DET may be maintained at a logical high level during periods when the level of the pumping voltage signal Vp increases but the level of the pumping voltage signal Vp is lower than the reference pumping voltage PUMP_REF, and may be maintained at a logical low level during other periods. That is, the determination signal DET may be periodically enabled in some periods of the pumping voltage signal Vp.

The determination signal DET generated by the determination signal generator 113 may be provided to the clock generator 111, and the clock generator 111 may generate the pumping clock signal CLK_P by performing an AND operation on the system clock signal CLK and the determination signal DET. Accordingly, as illustrated in FIG. 4, there exist pulse-type portions in the pumping clock signal CLK_P during periods when the charge pump 112 generates the pumping voltage signal Vp to generate the operating voltage Vg (i.e., during periods when the operating voltage Vg is applied to the memory cell array 160 of FIG. 2), but there are no pulse-type portions in the pumping clock signal CLK_P during other periods.

The voltage generator 110 has been described above with reference to FIGS. 3 and 4 as generating the operating voltage Vg, which is used for the operation of the NVM device 100, and also generating the pumping clock signal CLK_P using the system clock signal CLK, but the present inventive concepts are not limited thereto. The configuration of the voltage generator 110 may vary as necessary.

Referring again to FIG. 2, the P/F determining circuit 120 may receive the pumping clock signal CLK_P from the voltage generator 110 and may determine whether the electrical connections and/or wires included in the memory cell array 160 are defective by monitoring the pumping clock signal CLK_P. Specifically, the P/F determining circuit 120 may receive the pumping clock signal CLK_P from the voltage generator 110 and may determine whether the electrical connections and/or wires in the memory cell array 160, to which the operating voltage Vg is applied, are defective by comparing the pumping clock signal CLK_P with the reference clock signal REF_CLK. More specifically, the P/F determining circuit 120 may determine whether the word lines WL (for example, word lines WL1 through WL8 of FIG. 7) in the memory cell array 160, to which the operating voltage Vg is applied, are defective by comparing the number of pulses included in the pumping clock signal CLK_P and the number of pulses included in the reference clock signal REF_CLK.

If a particular word line WL (for example, one of the word lines WL1 through WL8 of FIG. 7) is determined as being defective, the P/F determining circuit 120 may provide a signal indicating that the particular word line WL is defective and/or that a memory block including the particular word line WL needs to be handled as a bad block to the control logic 150 as a P/F result signal "P/F."

The P/F determining circuit 120 will hereinafter be described with reference to FIG. 5.

Figure 5:
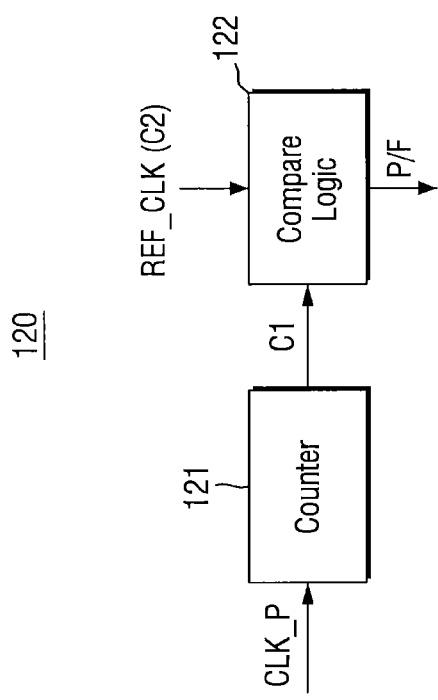
FIG. 5 is a block diagram illustrating the P/F determining circuit of FIG. 2.

FIG. 5 is a block diagram illustrating the P/F determining circuit of FIG. 2.

Referring to FIG. 5, the P/F determining circuit 120 may include a counter 121 and a compare logic 122.

The counter 121 may receive the pumping clock signal CLK_P, may count pulses included in the pumping clock signal CLK_P, and may output the result of the counting as a pulse count C1. Specifically, the counter 121 may receive the pumping clock signal CLK_P, may count pulses included in each period of the pumping clock signal CLK_P, and may output the result of the counting as the pulse count C1.

The compare logic 122 may generate and output the P/F result signal "P/F" by comparing a pulse count C2, which indicates the number of pulses included in the reference clock signal REF_CLK, and the pulse count C1, which is provided by the counter 121 and indicates the number of pulses included in the pumping clock signal CLK_P. In some embodiments, in a case where the pulse count C1 is greater than the pulse count C2, the compare logic 122 may generate and output a signal indicating that there exists a defective word line WL and/or that a memory block including the defective word line WL needs to be handled as a bad block as the P/F result signal "P/F." This will be described later in detail.

The P/F determining circuit 120 has been described above with reference to FIG. 5 as determining whether the wires and/or electrical connections included in the memory cell array 160 are defective by monitoring the pumping clock signal CLK_P, but the present inventive concepts are not limited thereto. That is, the configuration of the P/F determining circuit 120 may vary as necessary.

Referring again to FIG. 2, the address decoder 130 may choose one of a plurality of memory blocks BLK1 through BLKz of the memory cell array 160 in response to an input address. The address decoder 130 may be connected to the memory cell array 160 via the word lines WL, at least one string selection line SSL, and/or at least one ground selection signal GSL. The address decoder 130 may decode a column address, which is part of the input address. The decoded column address may be transmitted to the I/O circuit 140. In some embodiments, the address decoder 130 may include a row decoder, a column decoder, and/or an address buffer.

The I/O circuit 140 may be connected to the memory cell array 160 via a plurality of bit lines BL. The I/O circuit 140 may be configured to receive the decoded column address from the address decoder 130. The I/O circuit 140 may choose one of the bit lines BL using the decoded column address.

The I/O circuit 140 may include a plurality of page buffers, which store data to be programmed during a program operation of the NVM device 100 and/or store data read from the NVM device 100 during a read operation of the NVM device 100. Each of the page buffers may include a plurality of latches. Data stored in each of the page buffers during a program operation may be programmed to a page (for example, a group of memory cells) corresponding to a memory block selected via the bit lines BL. Data read from a page corresponding to a selected memory block during a read operation may be stored in the page buffers via the bit lines BL. The I/O circuit 140 may read data from a first region of the memory cell array 160 and may store the read data in a second region of the memory cell array 160. For example, the I/O circuit 140 may be configured to perform a copy-back operation.

The control logic 150 may control the general operation of the NVM device 100 such as a program operation, a read operation, an erase operation, and the like. Specifically, the control logic 150 may control the operations of the voltage generator 110, the P/F determining circuit 120, the address decoder 130, and the I/O circuit 140 while the NVM device 100 is operating. The control logic 150 may operate in response to the control signals CTRL and/or commands input thereto from the outside.

The memory cell array 160 may be implemented as, for example, a three-dimensional (3D) memory array. The 3D memory array may include a plurality of VNAND strings that are vertically oriented such that at least one memory cell is located over another memory cell. The at least one memory cell may include, for example, a charge trap layer. Each of the VNAND strings may include at least one selection transistor that is disposed above memory cells. The at least one selection transistor may have the same structure as memory cells and may, in some embodiments, be formed monolithically together with memory cells. As used herein, the term "monolithic" means that layers of each level of the 3D memory array may be directly deposited on the layers of each underlying level of the 3D memory array.

The 3D memory array may consist of a plurality of levels, and the word lines WL and/or the bit lines BL may be disposed to be shared between the levels. The NVM device 100 may, for example, be either a flash memory device in which a charge storage layer comprises a conductive floating gate or a charge trap flash (CTF) memory device in which a charge storage layer comprises an insulating film, but the present inventive concepts are not limited thereto. The NVM device 100 will hereinafter be described as being, for example, a VNAND flash memory device.

The memory cell array 160 may include the memory blocks BLK1 through BLKz. The memory blocks BLK1 through BLKz may be connected to the address decoder 130 via the word lines WL, the at least one string selection line SSL, and/or the at least one ground selection line GSL and may be connected to the I/O circuit 140 via the bit lines BL. In some embodiments, the word lines WL may have a laminated plate-like structure.

Each of the memory blocks BLK1 through BLKz may include a plurality of strings, which are arranged on a substrate along a first direction, along a second direction different from the first direction, and along a third direction perpendicular to the plane defined by the first and second directions and have a 3D structure. Each of the strings may include at least one string selection transistor, a plurality of memory cells, and/or at least one ground selection transistor, which are connected in series between a bit line BL and a common source line CSL. Each of the plurality of memory cells may store at least one bit. In some embodiments, at least one dummy cell may be provided between the at least one string selection transistor and the plurality of memory cells. In some embodiments, at least one dummy cell may be provided between the plurality of memory cells and the at least one ground selection transistor. The memory blocks BLK1 through BLKz of the memory cell array 160 will hereinafter be described with reference to FIGS. 6 and 7.

Figure 6:
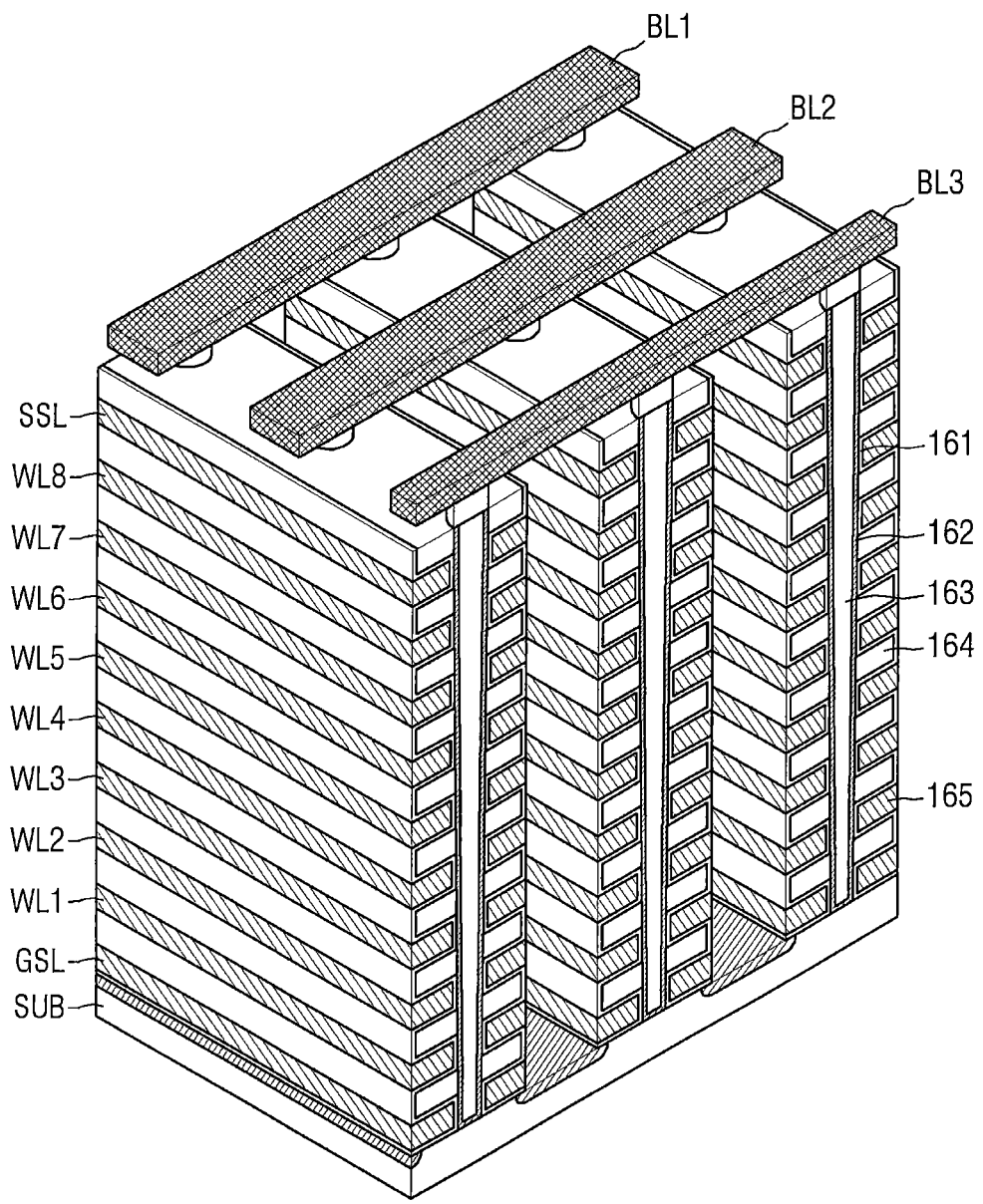
FIGS. 6 and 7 are diagrams illustrating the memory cell array of FIG. 2.
Figure 7:
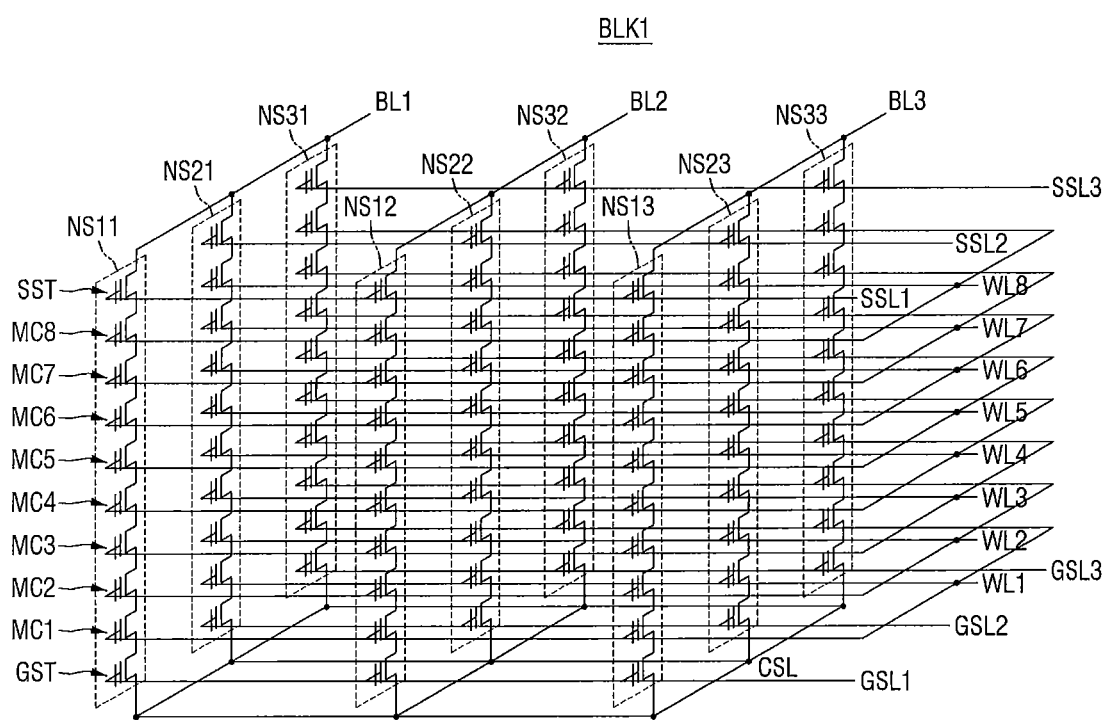

FIGS. 6 and 7 are diagrams illustrating the memory cell array of FIG. 2.

Referring to FIG. 6, an example memory block BLK1 may be formed in a vertical direction with respect to a substrate SUB. A region comprising impurities (e.g., a region doped with n+ impurities) may be formed on the substrate SUB.

Gate electrodes 165 and insulating films 164 may be alternately stacked on the substrate SUB. Data storage films 161 may be formed between the gate electrodes 165 and the insulating films 164.

Pillars may be formed to vertically penetrate the gate electrodes 165 and the insulating films 164. The pillars may be V-shaped (e.g., may have sloping sides). The pillars may penetrate the gate electrodes 165 and the insulating films 164 and may thus be connected to the substrate SUB. Filling dielectric patterns 163 may be formed on the inside of the pillars by using an insulating material such as silicon oxide. Vertical active patterns 162 may be formed on the outside (e.g., on an outer surface) of the pillars as a channel semiconductor.

Respective ones of the gate electrodes 165 of the memory block BLK1 may be connected to one of ground selection lines GSL1 through GSL3, the word lines WL1 through WL8, and/or one of string selection lines SSL1 through SSL3. The vertical active patterns 162, which are formed on the outside of the pillars, may be connected to one of bit lines BL1 through BL3. FIG. 6 illustrates an example in which the memory block BLK1 has two types of selection lines (i.e., the ground selection lines GSL1, GSL2, GSL3 and the string selection lines SSL1, SSL2, SSL3), eight word lines (i.e., the word lines WL1 through WL8), and three bit lines (i.e., the bit lines BL1 through BL3), but the present inventive concepts are not limited thereto. The number of wires and/or electrical connections provided in the memory block BLK1 may vary as necessary.

FIG. 7 is an equivalent circuit diagram illustrating the memory block BLK1. Referring to FIG. 7, cell strings NS11, NS12, NS13, NS21, NS22, NS23, NS31, NS32, and NS33 may be disposed between the bit lines BL1 through BL3 and the common source line CSL. Each of the cell strings NS11, NS12, NS13, NS21, NS22, NS23, NS31, NS32, and NS33 (for example, the cell string NS11) may include a ground selection transistor GST, a plurality of memory cells MC1 through MC8, and a string selection transistor SST.

The string selection transistor SST may be connected to one of the string selection lines SSL1 through SSL3. The ground selection transistor GST may be connected to one of the ground selection lines GSL1 through GSL3. In some embodiments, the ground selection lines GSL1 through GSL3 may be connected to one another. The string selection transistor SST may be connected to a bit line (e.g., one of the bit lines BL1 to BL3), and the ground selection transistor GST may be connected to the common source line CSL.

The memory cells MC1 through MC8 may be connected to the corresponding word lines WL1 through WL8, respectively. A group of memory cells connected to the same word line and programmed at the same time may be referred to as a page. The memory block BLK1 may include a plurality of pages. A plurality of pages may be connected to a single word line. Referring to FIG. 7, a word line (for example, the word line WL4) of a particular height from the common source line CSL may be connected in common to three pages.

Pages may be the units of program and read operations, and memory blocks may be the units of an erase operation. That is, when the NVM device 100 performs a program or read operation, data may be programmed or read in units of pages, and when the NVM device 100 performs an erase operation, data may be erased in units of memory blocks. That is, data stored in the memory cells MC1 through MC8 of the memory block BLK1 may all be erased at the same time.

Each of the memory cells MC1 through MC8 may store one-bit data or two or more-bit data. Memory cells capable of storing one-bit data may be referred to as single level cells (SLCs) or single bit cells. Memory cells capable of storing two or more-bit data may be referred to as multi-level cells (MLCs) or multi-bit cells. In the case of two-bit MLCs, two-page data may be stored in one physical page. Accordingly, six-page data may be stored in the memory cell MC4 connected to the word line WL4. Though FIGS. 6 and 7 described the structure of an example memory block BLK1, it will be understood that other memory blocks (e.g., memory blocks BLK2 to BLKz) of the memory cell array 160 (see FIG. 2) may be structured and/or operate the same or similarly.

A word line defect detection operation of the NVM device 100 will hereinafter be described with reference to FIGS. 3, 8, and 9.

FIGS. 8 and 9 are diagrams illustrating a word line defect detection operation of the NVM device 100 according to some embodiments of the inventive concepts.

Referring to FIGS. 3 and 8, if there are no defects in word lines WL(n−1), WLn, and WL(n+1) included in a memory block BLK, the charge pump 112 may output a normal pumping voltage signal Vp_n, and the determination signal generator 113 may generate the determination signal DET by comparing the normal pumping voltage signal Vp_n output by the charge pump 112 with the reference pumping voltage PUMP_REF. The clock generator 111 may generate the pumping clock signal CLK_P from the system clock signal CLK by using the determination signal DET output by the determination signal generator 113. The generation of the determination signal DET and the pumping clock signal CLK_P has already been described above with reference to FIG. 4, and thus, a detailed description thereof will be omitted.

Referring to FIGS. 3 and 9, if there exist bridge defects B in the word lines WL(n−1), WLn, and WL(n+1), the charge pump 112 may output a bridge pumping voltage signal Vp_b. The bridge pumping voltage signal Vp_b may take more time to reach its peak level than the normal pumping voltage signal Vp_n because the word lines WL(n−1), WLn, and WL(n+1) are all bridged to one another and as a result, current leakage occurs. That is, due to the bridge defects B between the adjacent word lines WL(n−1), WLn, and WL(n+1), the amount of time that it takes for the charge pump 112 to create a necessary voltage level may increase.

In this case, the amount of time that it takes for the charge pump 112 to reach the level of the reference pumping voltage PUMP_REF may also increase. Accordingly, the period of the determination signal DET may be elongated as compared to when there are no bridge defects between the word lines WL(n−1), WLn, and WL(n+1), as illustrated in FIG. 8. For example, referring to FIGS. 8 and 9, the number of pulses included in the pumping clock signal CLK_P increases from one to three.

In this manner, the NVM device 100 can detect defects in the word lines WL(n−1), WLn, and WL(n+1) of the memory block BLK. For example, in a case where the number of pulses included in the reference clock signal REF_CLK of FIG. 5 is determined in advance to be two, the NVM device 100 may determine the word lines WL(n−1), WLn, and WL(n+1) of the memory block BLK as being normal if the number of pulses included in the pumping clock signal CLK_P is one, as illustrated in FIG. 8, or may determine the word lines WL(n−1), WLn, and WL(n+1) of the memory block BLK as being defective if the number of pulses included in the pumping clock signal CLK_P is three, as illustrated in FIG. 9. That is, the NVM device 100 may detect defects in the word lines WL(n−1), WLn, and WL(n+1) of the memory block BLK by comparing the number of pulses included in the pumping clock signal CLK_P, i.e., the pulse count C1 of FIG. 5, with the number of pulses included in the reference clock signal REF_CLK of FIG. 5, i.e., the pulse count C2 of FIG. 5.

Although the normal pumping voltage signal Vp_n and the bridge pumping voltage signal Vp_b are illustrated in FIG. 9 as being clearly distinct from each other, the actual output of the charge pump 112 may differ from what is illustrated in FIG. 9. That is, the output of the charge pump 112 may be modified in various manners.

It will hereinafter be described how defects can be detected from the word lines WL(n−1), WLn, and WL(n+1) of the memory block BLK in a mode in which the NVM device 100 programs data through communication with the host HOST.

Figure 10:
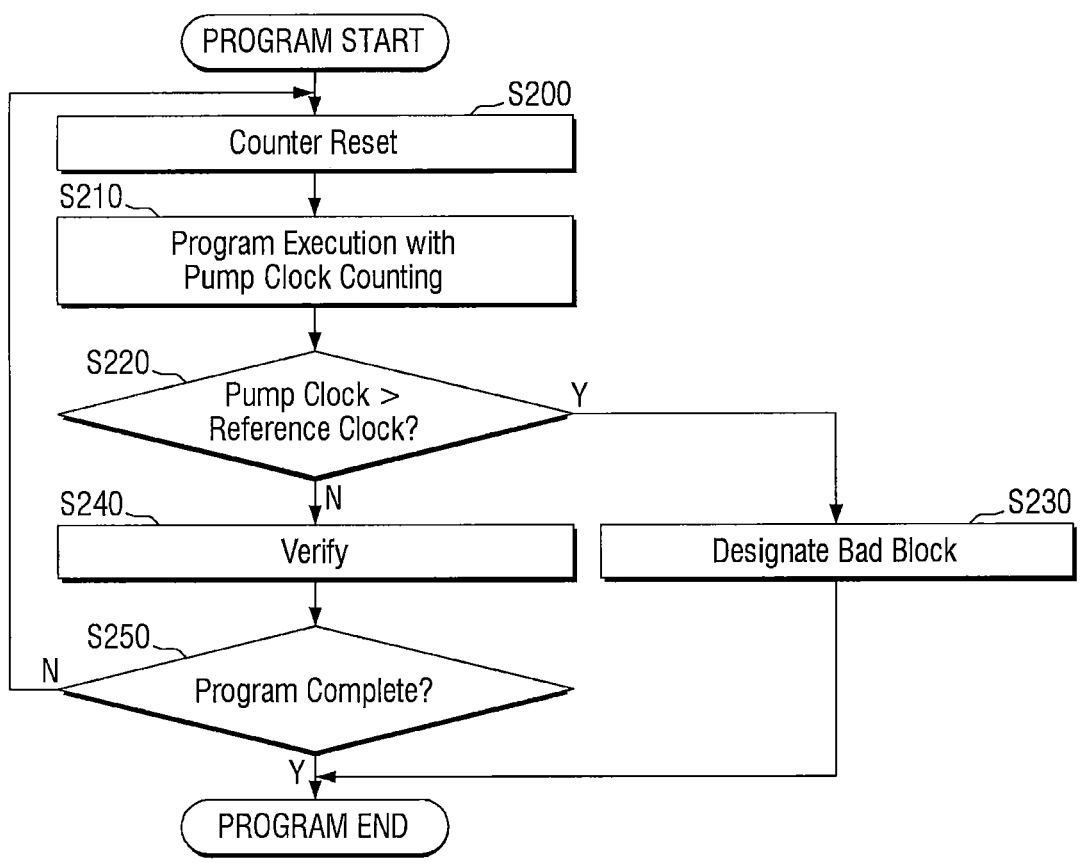
FIG. 10 is a flowchart illustrating the operation of the NVM device according to some embodiments of the inventive concepts.
Figure 11:
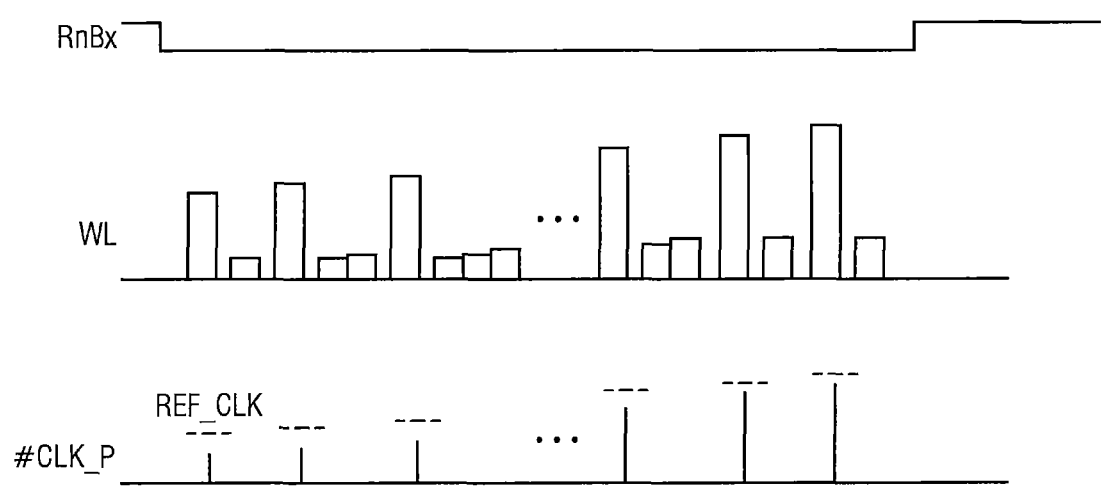
FIGS. 11 and 12 are diagrams further illustrating the operation of the NVM device according to some embodiments of the inventive concepts.
Figure 12:
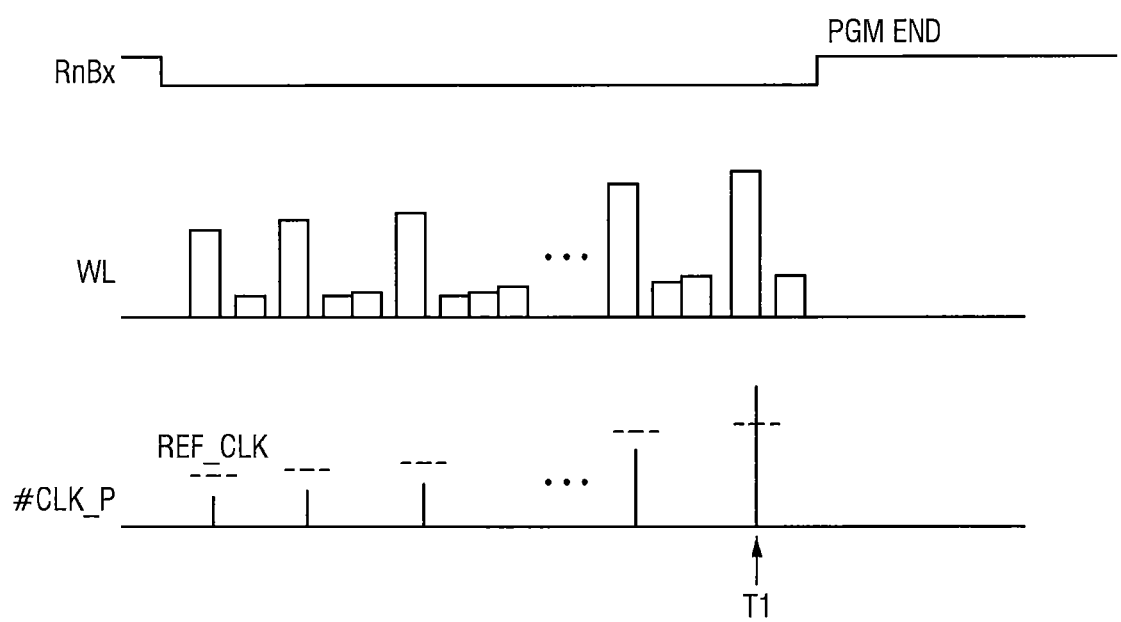

FIG. 10 is a flowchart illustrating the operation of the NVM device according to some embodiments of the inventive concepts. FIGS. 11 and 12 are diagrams further illustrating the operation of the NVM device according to some embodiments of the inventive concepts.

Referring to FIG. 10, a counter 121 may be reset (S200). For example, referring again to FIG. 5, the P/F determining circuit 120 may reset the counter 121 for a new defect detection operation.

Thereafter, referring to FIG. 10, a program operation may be performed while counting pulses included in a pumping clock signal (S210). For example, referring again to FIGS. 2 and 7, the voltage generator 110 may generate a program voltage to be provided to the word lines (e.g., word lines WL1 through WL8), in order to program the memory cells (e.g., memory cells MC1 through MC8) included in the memory cell array 160 or to program a page including the memory cells (e.g., memory cells MC1 through MC8). Then, the voltage generator 110 may provide the program voltage to the memory cell array 160. The P/F determining circuit 120 may count pulses included in the pumping clock signal CLK_P while the program voltage is being applied to the word lines (e.g., word lines WL1 through WL8).

Thereafter, referring to FIG. 10, a determination may be made as to whether the number of pulses included in the pumping clock signal CLK_P is greater than the number of pulses included in a reference clock signal REF_CLK (S220).

If the number of pulses included in the pumping clock signal CLK_P is greater than the number of pulses included in the reference clock signal REF_CLK (S220-Y), a defect is highly likely to exist in a word line. Thus, a memory block including the word line may be designated as a bad block, and/or the word line is designated as a defective word line (S230). Then, the program operation ends.

On the other hand, if the number of pulses included in the pumping clock signal CLK_P is smaller than the number of pulses included in the reference clock signal REF_CLK (S220-N), the word line may be determined as not being defective. Thus, a verification may be made as to whether the programming of memory cells or a page is complete (S240, S250). Then, if the programming of the memory cells or the page is yet to be complete (S250-N), the program operation may be continued (e.g. repeating the operations with resetting the counter (S200) and performing another program operation). On the other hand, if the programming of the memory cells or the page is complete (S250-Y), the program operation ends.

For example, referring again to FIG. 2, the P/F determining circuit 120 may determine whether the number of pulses included in the pumping clock signal CLK_P is greater than the number of pulses included in the reference clock signal REF_CLK.

If the number of pulses included in the pumping clock signal CLK_P is greater than the number of pulses included in the reference clock signal REF_CLK, the P/F determining circuit 120 may provide a signal indicating that a memory block including a word line WL to which the program voltage is applied, for example, the memory block BLK1, needs to be designated as a bad block to the control logic 150 as the P/F result signal "P/F."

On the other hand, if the number of pulses included in the pumping clock signal CLK_P is smaller than the number of pulses included in the reference clock signal REF_CLK, the P/F determining circuit 120 may verify whether the programming of the memory cells MC1 through MC8 or the page including the memory cells MC1 through MC8 is complete, and may continue to perform a program operation until the programming of the memory cells MC1 through MC8 or the page including the memory cells MC1 through MC8 is complete.

Cases where there is no defect in a word line and where there is a defect in a word line will hereinafter be described with reference to FIGS. 11 and 12.

FIG. 11 is a timing diagram illustrating a case where there is no defect in a word line.

Referring to FIG. 11, a predetermined program voltage may be applied to a word line WL after a mode signal RnBx is enabled.

The line denoted as "WL" in FIG. 11 illustrates voltages of various magnitudes being applied to the word line WL during programming. The line denoted as "#CLK_P" illustrates a periodic comparison of the number of pulses included in the pumping clock CLK_P to the number of pulses included in the reference clock signal REF_CLK. Since the number of pulses included in the pumping clock signal CLK_P is smaller than the number of pulses included in the reference clock signal REF_CLK whenever the program voltage is applied to the word line WL, the program operation may be continued because there is no defect in the word line WL. In some embodiments, the program operation may be performed by repeatedly applying the predetermined program voltage (such as, for example, a program voltage whose level gradually increases) to the memory cell array 160.

Once the programming of a plurality of memory cells or a page including the plurality of memory cells is complete, the application of the program voltage to the memory cell array 160 may be terminated, and the mode signal RnBx may be disabled, thereby completing the program operation.

FIG. 12 is a timing diagram illustrating a case where there is a defect in a word line.

Referring to FIG. 12, a predetermined program voltage may be applied to a word line WL after the mode signal RnBx is enabled.

Since there is a defect in the word line WL, there may arise a case where the number of pulses included in the pumping clock signal CLK_P becomes greater than the number of pulses included in the reference clock signal REF_CLK during the application of a program voltage to the word line WL, particularly, at a time T1.

When the number of pulses included in the pumping clock signal CLK_P becomes greater than the number of pulses included in the reference clock signal REF_CLK, the application of the program voltage may be readily terminated. Then, the user mode signal RnBx may be disabled, thereby terminating the program operation. That is, if a word line defect is detected during the program operation, the application of the program voltage may be readily terminated so that waste of power can be prevented. Accordingly, the operating performance of the NVM device 100 can be improved.

It has been described how the number of pulses included in the pumping clock signal CLK_P may vary depending on the presence of a word line defect and how a word line defect can be detected based on variations in the number of pulses included in the pumping clock signal CLK_P. The number of pulses included in the pumping clock signal CLK_P may vary considerably depending on whether there are defects in the word lines WL, but may also vary depending on the operating conditions of the NVM device 100, and this will hereinafter be described with reference to FIG. 13.

Figure 13:
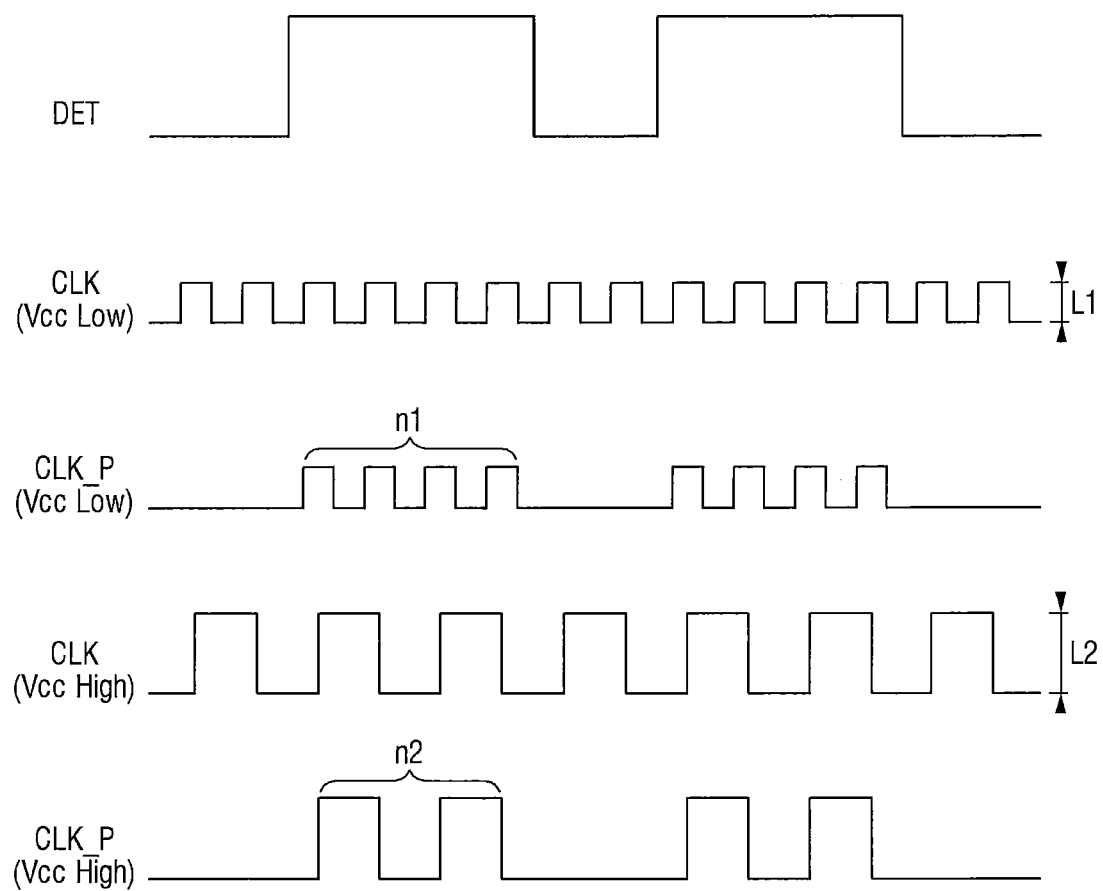
FIG. 13 is a diagram illustrating variations in a pumping clock signal in accordance with variations in a power supply voltage.

FIG. 13 is a diagram illustrating variations in a pumping clock signal CLK_P in accordance with variations in a power supply voltage.

Specifically, FIG. 13 shows variations in the pumping clock signal CLK_P when a low power supply voltage Vcc Low is provided to an NVM device 100 and variations in the pumping clock signal CLK_P when a high power supply voltage Vcc High is provided to an NVM device 100. For convenience of understanding, the difference in the pattern of variation of the pumping clock signal CLK_P between when a low power supply voltage Vcc is provided and when a high power supply voltage Vcc is provided is slightly exaggerated in FIG. 13, and the pumping clock signal CLK_P may not necessarily change as illustrated in FIG. 13.

Referring to FIG. 13, the level of the system clock signal CLK may vary with the power supply voltage Vcc provided to an NVM device 100. For example, when the power supply voltage Vcc is low, the system clock signal CLK may have a first level L1, and when the power supply voltage Vcc is high, the system clock signal CLK may have a second level L2, which is higher than the first level L1.

Since the pumping voltage signal Vp of FIG. 3 may be compensated for by, for example, an oscillator, the determination signal DET, unlike the system clock signal CLK, may be uniformly maintained regardless of variations in the power supply voltage Vcc.

Accordingly, as illustrated in FIG. 13, the pumping clock signal CLK_P may be influenced by variations in the power supply voltage Vcc. That is, when the power supply voltage Vcc is low, the pumping clock signal CLK_P may include a relatively large number n1 of pulses regardless of the presence of defects in the word lines WL, and when the power supply voltage Vcc is high, the pumping clock signal CLK_P may include a relatively small number n2 of pulses regardless of the presence of defects in the word lines WL.

In this case, if the number of pulses included in the reference clock signal REF_CLK is between n1 and n2 (for example, 3 in the example of FIG. 13), the word lines WL may be mistakenly determined as being defective, regardless of the actual presence of defects in the word lines WL, depending on variations in the power supply voltage Vcc.

Thus, there is the need to compensate for the reference clock signal REF_CLK or control the pumping clock signal CLK_P in consideration of variations in the power supply voltage Vcc, and this will hereinafter be described.

Figure 14:
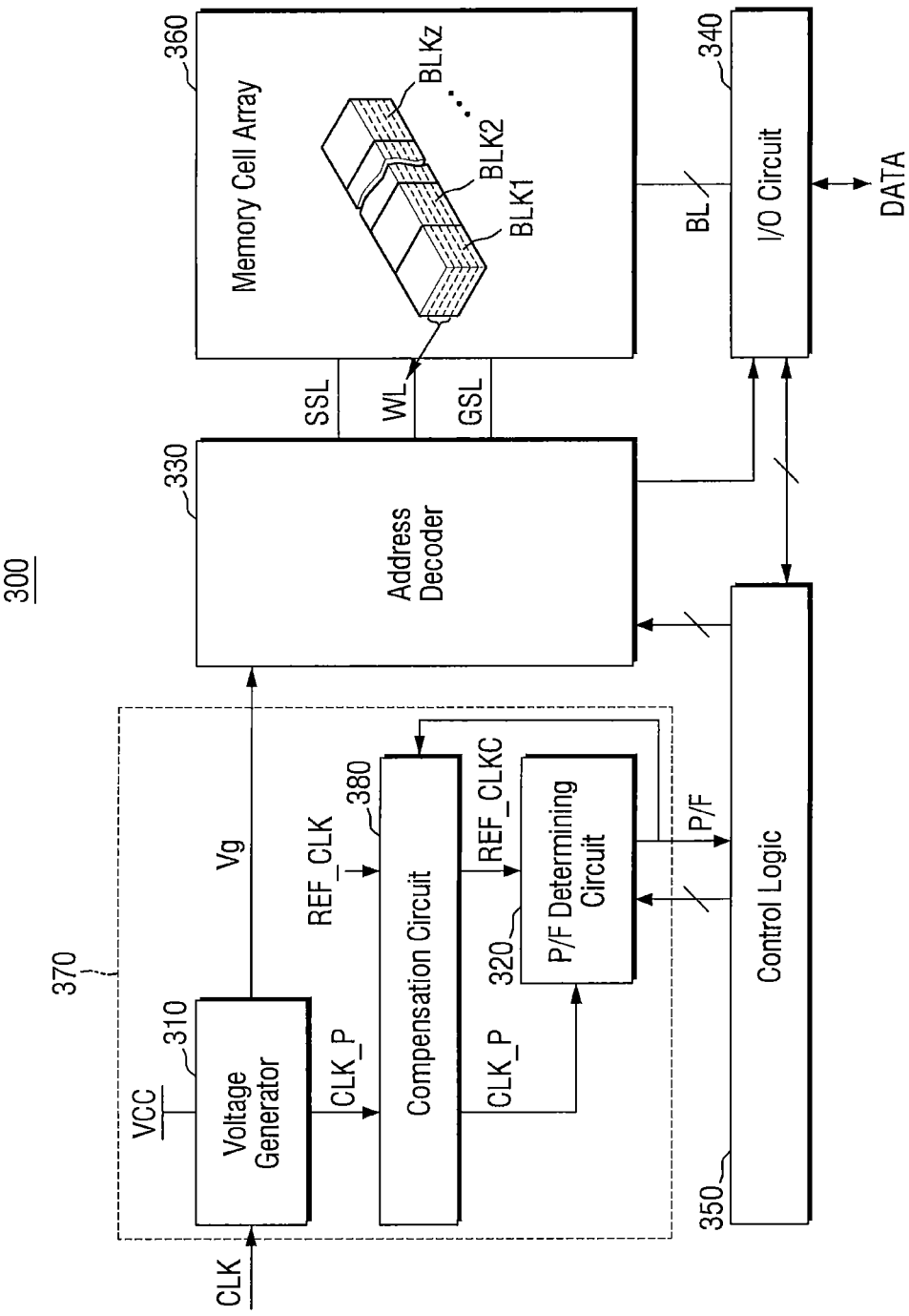
FIG. 14 is a block diagram illustrating an NVM device according to some embodiments of the inventive concepts.

FIG. 14 is a block diagram illustrating an NVM device 300 according to some embodiments of the inventive concepts.

Referring to FIG. 14, an NVM device 300 may include a word line defect detection circuit 370, an address decoder 330, an I/O circuit 340, a control logic 350, and a memory cell array 360.

The address decoder 330, the I/O circuit 340, the control logic 350, the memory cell array 360 may be substantially the same as their respective counterparts of FIG. 2, and thus, detailed descriptions thereof will be omitted.

The word line defect detection circuit 370 may include a compensation circuit 380, which compensates for a reference clock signal REF_CLK and outputs a compensated reference clock signal REF_CLKC. The word line defect detection circuit 370 may further include a voltage generator 310 and a P/F determining circuit 320.

The voltage generator 310 may generate an operating voltage Vg, which is used for the operation of the NVM device 300, using a power supply voltage Vcc. Also, the voltage generator 310 may generate a pumping clock signal CLK_P in the same manner described above with reference to FIG. 3 and may provide the pumping clock signal CLK_P to the compensation circuit 380.

The compensation circuit 380 may generate the compensated reference clock signal REF_CLKC using the pumping clock signal CLK_P. The compensated reference clock signal REF_CLKC may be provided to the P/F determining circuit 320 and may be used to detect a word line defect.

The P/F determining circuit 320 may determine whether word lines WL included in the memory cell array 360 are defective by monitoring the pumping clock signal CLK_P. Specifically, the P/F determining circuit 320 may determine whether the word lines WL, to which the operating voltage Vg is applied, in the memory cell array 360 are defective by comparing the number of pulses included in the pumping clock signal CLK_P and the number of pulses included in the compensated reference clock signal REF_CLKC.

It will hereinafter be described how the compensation circuit 380 can compensate for the reference clock signal REF_CLK using the pumping clock signal CLK_P with reference to FIG. 15.

Figure 15:
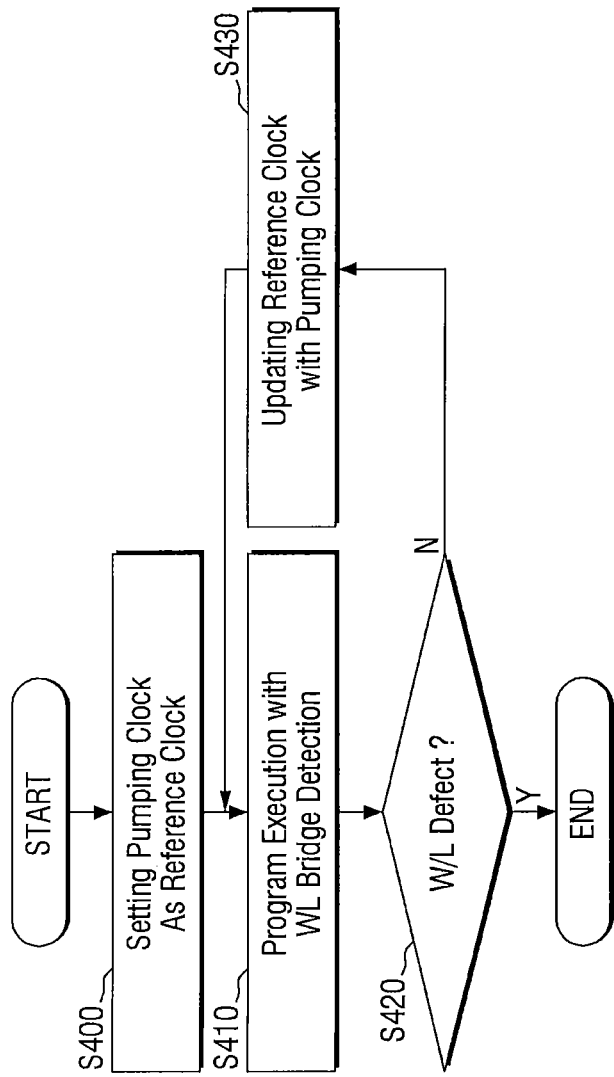
FIG. 15 is a flowchart illustrating the operation of the NVM device of FIG. 14.

FIG. 15 is a flowchart illustrating the operation of the NVM device 300 of FIG. 14.

Referring to FIG. 15, a pumping clock signal CLK_P is set as a reference clock signal REF_CLK (S400).

For example, referring again to FIG. 14, the compensation circuit 380 may assume that there is no bridge defect in a selected word line WL and may set the pumping clock signal CLK_P, generated while applying a program voltage, as the reference clock signal REF_CLK. That is, the compensation circuit 380 may set the pumping clock signal CLK_P, generated while applying a program voltage to the selected word line WL, as the initial value of the reference clock signal REF_CLK. Specifically, the compensation circuit 380 may set the number of pulses included in the pumping clock signal CLK_P, generated while applying a program voltage to the selected word line WL, as the initial value of the reference clock signal REF_CLK.

Since the assumption is made that the selected word line WL has no bridge defect, a word line WL at which a bridge defect rarely occurs may be selected in the first place.

For example, a VNAND memory may be formed to be narrower at the bottom thereof than at the top thereof, as illustrated in FIG. 6. Thus, bridge defects are more likely to occur at word lines (for example, the word lines WL1 and WL2 of FIG. 6) disposed at a lower part of the VNAND memory than at word lines (for example, the word lines WL7 and WL8 of FIG. 6) disposed at an upper part of the VNAND memory. Thus, the compensation circuit 380 may set the pumping clock signal CLK_P, generated while applying a program voltage to word lines (for example, the word lines WL7 and WL8 of FIG. 6) disposed at an upper part of the memory cell array 360, as the reference clock signal REF_CLK.

In this manner, the pumping clock signal CLK_P may be set as the reference clock signal REF_CLK, and the compensation circuit 380 may provide the reference clock signal REF_CLK to the P/F determining circuit 320 as the compensated reference clock signal REF_CLKC.

Thereafter, referring to FIG. 15, a program operation is performed while detecting a word line bridge defect (S410).

The program operation performed in S410 is almost the same as the program operation performed in S210 described above with reference to FIG. 10, and thus, a detailed description thereof will be omitted. For example, referring again to FIG. 14, the P/F determining circuit 320 may determine whether a word line WL is defective by comparing the number of pulses included in the pumping clock signal CLK_P with the number of pulses included in the compensated reference clock signal REF_CLKC provided by the compensation circuit 380.

Thereafter, referring to FIG. 15, a determination is made as to whether there exists a defect in a word line (S420). If there is no defect in the word line (S420-N), the reference clock signal may be updated with a pumping clock signal CLK_P (S430). On the other hand, if there is a defect in the word line (S420-Y), the reference clock signal may not be updated with the pumping clock signal CLK_P because the pumping clock signal CLK_P cannot be used as the reference clock signal.

For example, referring again to FIG. 14, if the P/F determining circuit 320 determines that there is no defect in a word line WL based on the result of comparing the number of pulses included in the pumping clock signal CLK_P and the number of pulses included in the compensated reference clock signal REF_CLKC provided by the compensation circuit 380, the compensation circuit 380 may update the pumping clock signal CLK_P as a new reference clock signal REF_CLK. Also, the compensation circuit 380 may provide the new reference clock signal REF_CLK as a compensated reference clock signal REF_CLKC for a new defect detection operation of the P/F determining circuit 320. On the other hand, if the P/F determining circuit 320 determines that there is a defect in the word line WL, the compensation circuit 380 does not use the pumping clock signal CLK_P as the compensated reference clock signal REF_CLKC.

In the embodiment of FIG. 15, S410, S420, and S430 may be repeatedly performed in the course of the programming of the memory cell. That is, S410, S420, and S430 may be repeatedly performed in the process of applying different program voltages (for example, a program voltage whose level increases) to the same word line in order to program one memory cell or applying different program voltages to different word lines in order to program different memory cells.

In this manner, when no defect is detected from the word line WL, the influence of variations in the power supply voltage Vcc during the detection of a word line defect can be minimized by using the pumping clock signal CLK_P into which variations in the power supply voltage Vcc can be readily reflected, as illustrated in FIG. 13, as the compensated reference clock signal REF_CLKC for the detection of a word line defect. As a result, the operating reliability of an NVM device 300 can be improved.

Figure 16:
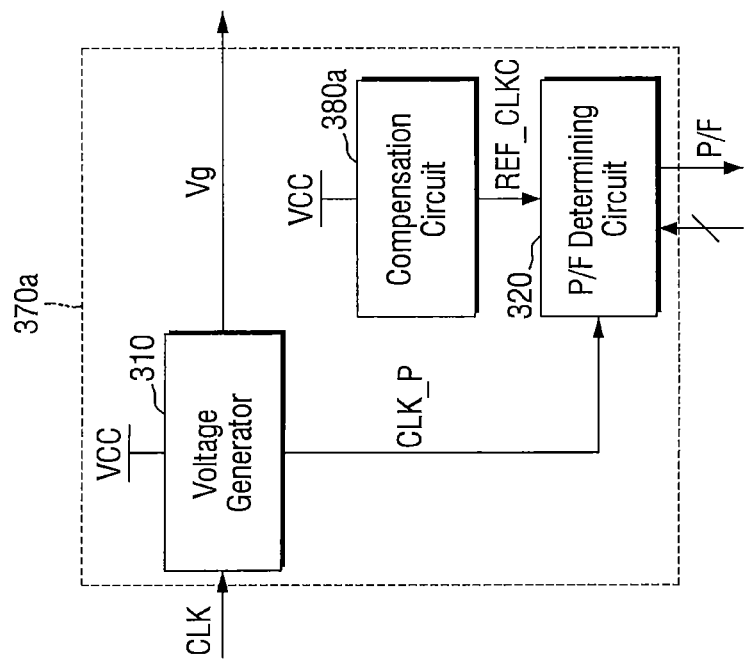
FIG. 16 is a block diagram illustrating a word line defect detection circuit according to some embodiments of the inventive concepts.

FIG. 16 is a block diagram illustrating a word line defect detection circuit 370a according to some embodiments of the inventive concepts.

Referring to FIG. 16, a compensation circuit 380a of a word line defect detection circuit 370a may generate a compensated reference clock signal REF_CLKC using a power supply voltage Vcc. That is, the compensation circuit 380a may receive the power supply voltage Vcc, may generate the compensated reference clock signal REF_CLKC in accordance with the level of the power supply voltage Vcc, and may provide the compensated reference clock signal REF_CLKC to the P/F determining circuit 320 of FIG. 16.

The compensation circuit 380a may be implemented in various configurations. A compensation circuit 380a will hereinafter be described with reference to FIG. 17.

Figure 17:
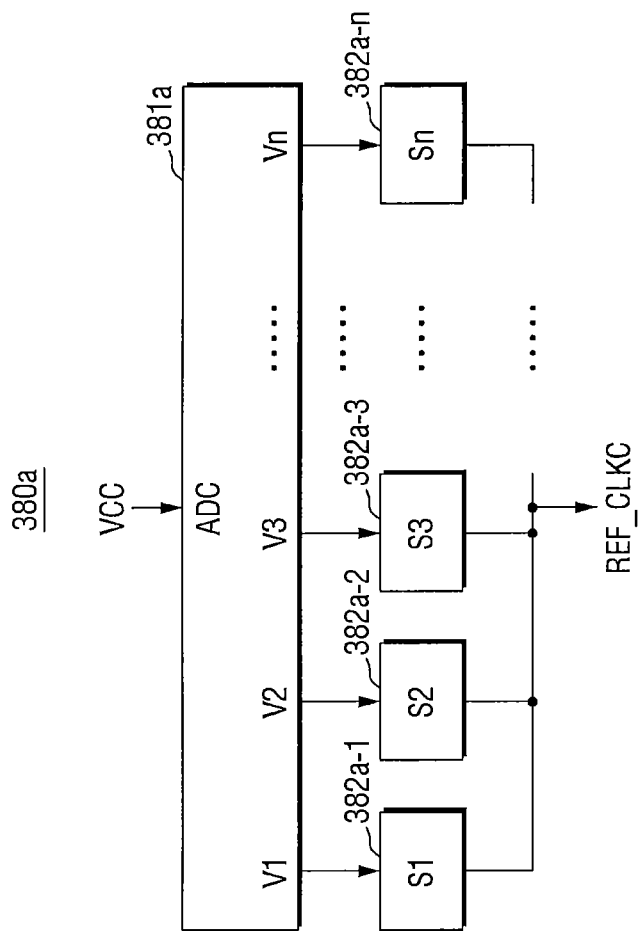
FIG. 17 is a block diagram illustrating the compensation circuit of FIG. 16.

FIG. 17 is a block diagram illustrating the compensation circuit of FIG. 16.

Referring to FIG. 17, the compensation circuit 380a may include an analog-to-digital converter (ADC) 381a and a plurality of storage units 382a-1 through 382a-n.

One of a plurality of output terminals V1 through Vn of the ADC 381a may be selected in accordance with the level of a power supply voltage Vcc provided to the ADC 381a. Different reference clock signals REF_CLKC may be stored in the storage units 382a-1 through 382a-n. The reference clock signal REF_CLK stored in one of the storage units 382a-1 through 382a-n that is connected to the selected output terminal may be output as a compensated reference clock signal REF_CLKC.

Specifically, reference clock signals REF_CLKC having different numbers of pulses may be stored in the storage units 382a-1 through 382a-n, and the number of pulses of the reference clock signal REF_CLK stored in one of the storage units 382a-1 through 382a-n that is connected to the selected output terminal may be output as the number of pulses of the compensated reference clock signal REF_CLKC and may be provided to the P/F determining circuit 320 of FIG. 16. For example, one of the storage units 382a-1 through 382a-n may store a first reference clock signal having a first number of pulses n, where n is a natural number, and another one of the storage units 382a-1 through 382a-n may store a second reference clock signal having a second number of pulses m where m is a natural number different than n.

In this case, since the compensated reference clock signal REF_CLKC varies in accordance with variations in the power supply voltage Vcc, the influence of variations in the power supply voltage Vcc during the detection of a word line defect can be minimized. As a result, the operating reliability of an NVM device 300 can be improved.

Figure 18:
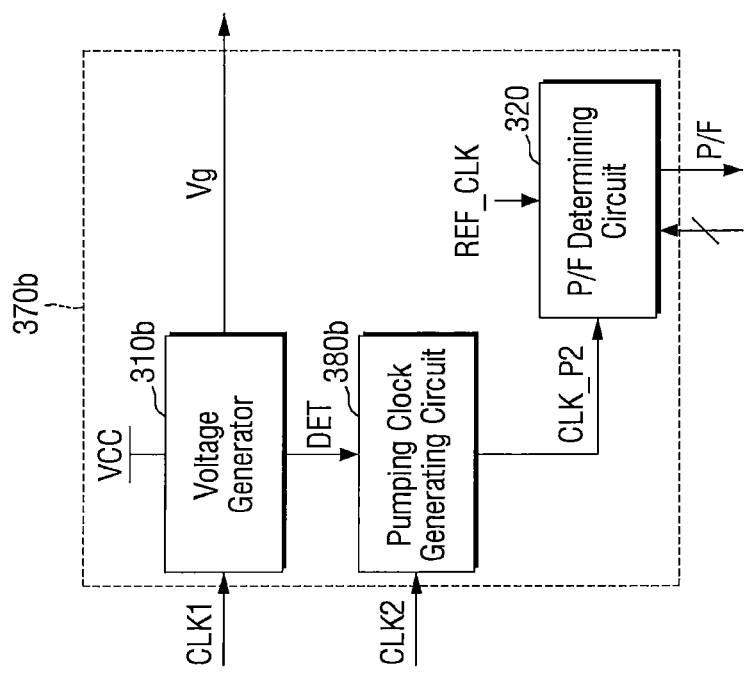
FIG. 18 is a block diagram illustrating a word line defect detection circuit according to some embodiments of the inventive concepts.

FIG. 18 is a block diagram illustrating a word line defect detection circuit 370b according to some embodiments of the inventive concepts.

Referring to FIG. 18, a word line defect detection circuit 370b may include a voltage generator 310b, a pumping clock generating circuit 380b, and a P/F determining circuit 320.

The voltage generator 310b may generate an operating voltage Vg, which is used for the operation of the NVM device 300, and a determination signal DET using a first system clock signal CLK1 and a power supply voltage Vcc.

The pumping clock generating circuit 380b may generate a second pumping clock signal CLK_P2 using a second system clock signal CLK2 and the determination signal DET.

The P/F determining circuit 320 may detect any defects in word lines by comparing the second pumping clock signal CLK_P2 and a reference clock signal REF_CLK.

The second system clock signal CLK2 may be a different signal from the first system clock signal CLK1. Specifically, the first system clock signal CLK1 may be a signal varying in accordance with variations in a power supply voltage Vcc, as illustrated in FIG. 13, but the second system clock signal CLK2 may be a signal that is independent from variations in the power supply voltage Vcc.

As already mentioned above with reference to FIG. 13, the determination signal DET may be uniformly maintained regardless of variations in the power supply voltage Vcc. In the embodiment of FIG. 18, the second pumping clock signal CLK_P2 may be generated using the second system clock signal CLK2 and the determination signal DET, which are both independent from variations in the power supply voltage Vcc, and may be used to detect a word line defect. Accordingly, the influence of variations in the power supply voltage Vcc during the detection of a word line defect can be minimized.

The word line defect detection circuit 370b may be implemented in various configurations. A word line defect detection circuit 370b will hereinafter be described with reference to FIG. 19.

Figure 19:
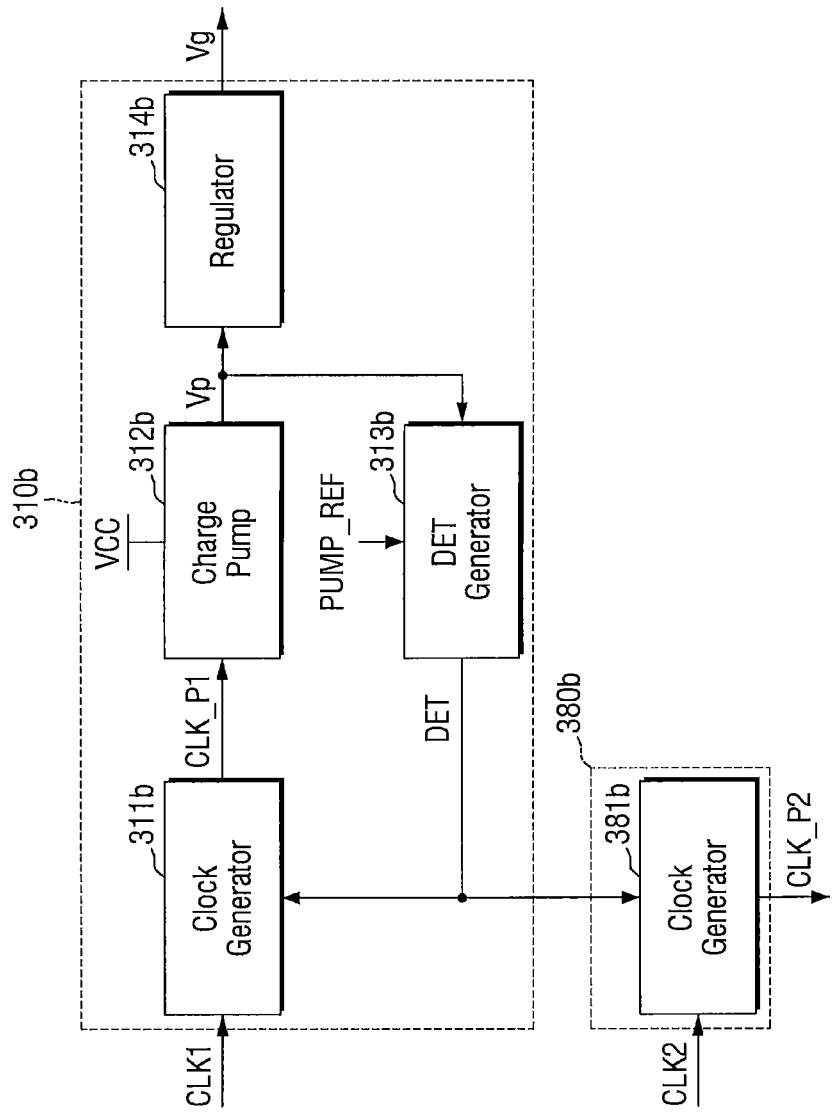
FIG. 19 is a block diagram illustrating portions of the word line defect detection circuit of FIG. 18.

FIG. 19 is a block diagram illustrating portions of the word line defect detection circuit 370b of FIG. 18.

Referring to FIG. 19, the voltage generator 310b may include a first clock generator 311b, a charge pump 312b, a determination signal generator 313b, and a regulator 314b.

The configuration of the voltage generator 310b may be similar to that described above with reference to the voltage generator 110 of FIG. 3. A first pumping clock signal CLK_P1, which is generated by the first clock generator 311b based on the determination signal DET and the first system clock signal CLK1, may be provided to the charge pump 312b, but not to the P/F determining circuit 320 of FIG. 18. The determination signal DET, which is generated by the determination signal generator 313b, may be provided not only to the first clock generator 311b, but also to the second clock generator 381b.

The pumping clock generating circuit 380b may include a second clock generator 381b. The second clock generator 381b may generate the second pumping clock signal CLK_P2 by performing, for example, an AND operation on the second system clock signal CLK2, which may be independent from variations in the power supply voltage Vcc, and the determination signal DET, which is provided by the determination signal generator 313b. The second pumping clock signal CLK_P2 may be provided to the P/F determining circuit 320 of FIG. 18 and may be used to detect a word line defect through comparison with the reference clock signal REF_CLK.

It will be understood that although the terms "first," "second," etc. are used herein to describe members, regions, layers, portions, sections, components, and/or elements in example embodiments of the inventive concepts, the members, regions, layers, portions, sections, components, and/or elements should not be limited by these terms. These terms are only used to distinguish one member, region, portion, section, component, or element from another member, region, portion, section, component, or element. Thus, a first member, region, portion, section, component, or element described below may also be referred to as a second member, region, portion, section, component, or element without departing from the scope of the inventive concepts. For example, a first element may also be referred to as a second element, and similarly, a second element may also be referred to as a first element, without departing from the scope of the inventive concepts.

Spatially relative terms, such as "beneath," "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by those of ordinary skill in the art to which the inventive concepts pertain. It will also be understood that terms, such as those defined in commonly used dictionaries, should be interpreted as having a meaning that is consistent with their meaning in the context of this specification and the relevant art and will not be interpreted in an idealized or overly formal sense unless expressly so defined herein.

When a certain example embodiment may be implemented differently, a specific process order may be performed differently from the described order. For example, two consecutively described processes may be performed substantially at the same time or performed in an order opposite to the described order.

In the accompanying drawings, variations from the illustrated shapes as a result, for example, of manufacturing techniques and/or tolerances, are to be expected. Thus, the example embodiments of the inventive concepts should not be construed as being limited to the particular shapes of regions illustrated herein but may be construed to include deviations in shapes that result, for example, from a manufacturing process. For example, an etched region illustrated as a rectangular shape may be a rounded or certain curvature shape. Thus, the regions illustrated in the figures are schematic in nature, and the shapes of the regions illustrated in the figures are intended to illustrate particular shapes of regions of devices and not intended to limit the scope of the present inventive concepts. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on").

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Although some embodiments of the present inventive concepts have been disclosed for illustrative purposes, those skilled in the art will appreciate that various modifications, additions and substitutions are possible, without departing from the scope and spirit of the inventive concepts as disclosed in the accompanying claims.

What is claimed is:

1. A memory device comprising:
    a memory cell array comprising a memory cell and a word line that is connected to the memory cell;
    a clock generator configured to generate a first pumping clock signal from a system clock signal;
    a charge pump configured to provide a pumping voltage signal using a power supply voltage and the first pumping clock signal;
    a compensation circuit configured to compensate for variations in a first reference clock signal in accordance with variations in the power supply voltage and provide a compensated first reference clock signal; and
    a pass/fail (P/F) determining circuit configured to determine whether the word line is defective by comparing the first pumping clock signal and the compensated first reference clock signal while the pumping voltage signal is provided to the word line.

2. The memory device of claim 1, wherein the P/F determining circuit determines whether the word line is defective by comparing a first number of pulses included in the first pumping clock signal and a second number of pulses included in the compensated first reference clock signal.

3. The memory device of claim 2, wherein the P/F determining circuit comprises a counter that is configured to count the first number of pulses included in the first pumping clock signal, and a compare logic that is configured to determine whether the word line is defective by comparing the first number of pulses included in the first pumping clock signal and the second number of pulses included in the compensated first reference clock signal.

4. The memory device of claim 1, further comprising:
a determination signal generator configured to receive the pumping voltage signal and provide a determination signal by comparing the pumping voltage signal with a reference pumping voltage,
wherein the clock generator is configured to generate the first pumping clock signal using the determination signal.

5. The memory device of claim 1, wherein the compensation circuit provides the compensated first reference clock signal using the first pumping clock signal.

6. The memory device of claim 5, wherein the compensation circuit sets the first pumping clock signal as the compensated first reference clock signal responsive to a determination that the word line is not defective.

7. The memory device of claim 6, wherein the compensation circuit sets a first number of pulses included in the first pumping clock signal as a second number of pulses included in the compensated first reference clock signal, and
wherein the P/F determining circuit determines whether the word line is defective by comparing a third number of pulses included in a second pumping clock signal that is different from the first pumping clock signal and the second number of pulses included in the compensated first reference clock signal.

8. The memory device of claim 1, wherein the compensation circuit provides the compensated first reference clock signal using the power supply voltage.

9. The memory device of claim 8, wherein the compensation circuit comprises a first storage unit that is configured to store a second reference clock signal and a second storage unit that is configured to store a third reference clock signal, different from the second reference clock signal, and
wherein the compensation circuit sets one of the second or third reference clock signals as the compensated first reference clock signal in accordance with a level of the power supply voltage.

10. The memory device of claim 9, wherein the second reference clock signal comprises n pulses (where n is a natural number),
wherein the third reference clock signal comprises m pulses (where m is a natural number different from n),
wherein the compensation circuit outputs one of n or m as a first number of pulses included in the compensated first reference clock signal in accordance with the level of the power supply voltage, and
wherein the P/F determining circuit determines whether the word line is defective by comparing a second number of pulses included in the first pumping clock signal and the first number of pulses included in the compensated first reference clock signal.

11. A memory device comprising:
a memory cell array comprising a memory cell and a word line that is connected to the memory cell;
a voltage generator configured to receive a power supply voltage, generate a pumping clock signal, and provide an operating voltage to the word line to program the memory cell;
a compensation circuit configured to provide a compensated reference clock signal that compensates for variations in the power supply voltage and;
a pass/fail (P/F) determining circuit configured to determine whether the word line is defective by comparing a first number of pulses included in the pumping clock signal and a second number of pulses included in the compensated reference clock signal.

12. The memory device of claim 11, wherein the voltage generator comprises:
a charge pump configured to provide a pumping voltage signal using the power supply voltage and the pumping clock signal; and
a determination signal generator configured to receive the pumping voltage signal and provide a determination signal by comparing the pumping voltage signal with a reference pumping voltage,
wherein the voltage generator is configured to generate the pumping clock signal using the determination signal.

13. The memory device of claim 11, wherein the compensation circuit is configured to set the pumping clock signal as the compensated reference clock signal responsive to a determination that the word line is not defective.

14. The memory device of claim 11, wherein the compensation circuit is configured to set the pumping clock signal as the compensated reference clock signal responsive to a determination that the memory cell is located in an upper part of the memory cell array.

15. The memory device of claim 11, wherein the compensation circuit is configured to provide the compensated reference clock signal based on the power supply voltage.

16. The memory device of claim 15, wherein the compensation circuit comprises:
an analog-to-digital converter configured to select one of a plurality of output terminals based on a level of the power supply voltage,
wherein the compensation circuit is configured to output one of a first reference clock signal or a second reference clock signal as the compensated reference clock signal based on an output of the analog-to-digital converter.

17. The memory device of claim 11, wherein the compensation circuit provides the second number of pulses included in the compensated reference clock signal based on a level of the power supply voltage.

18. A memory device comprising:
a voltage generator configured to receive a power supply voltage, to generate an operating voltage using the power supply voltage, and to generate a pumping clock signal;
a compensation circuit configured to provide a compensated reference clock signal that compensates for variations in the power supply voltage;
a pass/fail (P/F) determining circuit configured to perform a comparison of a first number of pulses of the pumping clock signal and a second number of pulses of the compensated reference clock signal and to generate a pass/fail signal responsive to the comparison; and
a controller configured to control operation of the memory device responsive to the pass/fail signal.

19. The memory device of claim 18, wherein the compensation circuit comprises a first storage unit that is configured to store a first reference clock signal and a second storage unit that is configured to store a second reference clock signal, different from the first reference clock signal, and
wherein the compensation circuit sets one of the first or second reference clock signals as the compensated reference clock signal in accordance with a level of the power supply voltage.

20. The memory device of claim 18, wherein the compensation circuit comprises:

an analog-to-digital converter configured to select one of a plurality of output terminals based on a level of the power supply voltage,
wherein the compensation circuit is configured to output the compensated reference clock signal based on an output of the analog-to-digital converter.

* * * * *